US008809075B2

(12) United States Patent
Ikushima

(10) Patent No.: US 8,809,075 B2
(45) Date of Patent: *Aug. 19, 2014

(54) METHOD FOR APPLYING LIQUID MATERIAL UTILIZING CAPILLARY PHENOMENON

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 234 days.

This patent is subject to a terminal disclaimer.

(21) Appl. No.: 13/378,074

(22) PCT Filed: Jun. 11, 2010

(86) PCT No.: PCT/JP2010/059904
§ 371 (c)(1),
(2), (4) Date: Mar. 1, 2012

(87) PCT Pub. No.: WO2010/147052
PCT Pub. Date: Dec. 23, 2010

(65) Prior Publication Data
US 2012/0156808 A1    Jun. 21, 2012

(30) Foreign Application Priority Data
Jun. 15, 2009    (JP) ................. 2009-142777

(51) Int. Cl.
*G01R 31/26*    (2014.01)
*H01L 21/66*    (2006.01)
(52) U.S. Cl.
USPC ............. 438/15; 438/108; 438/124; 438/126; 438/127; 257/778; 257/787; 257/E21.528; 264/40.1; 264/263; 264/272.17; 425/110
(58) Field of Classification Search
None
See application file for complete search history.

(56) References Cited

U.S. PATENT DOCUMENTS

| 7,939,125 | B2 | 5/2011 | Abernathy et al. |
| 8,197,738 | B2 * | 6/2012 | Ikushima ............ 264/263 |
| 8,288,173 | B2 * | 10/2012 | Ikushima ............ 438/5 |
| 2005/0001869 | A1 | 1/2005 | Abernathy et al. |
| 2010/0052198 | A1 | 3/2010 | Ikushima |
| 2010/0075021 | A1 | 3/2010 | Ikushima |

(Continued)

FOREIGN PATENT DOCUMENTS

| EP | 2 202 005 A1 | 6/2010 |
| JP | 2004-344883 A | 12/2004 |

(Continued)

OTHER PUBLICATIONS

International Search Report of PCT/JP2010/059904, date of mailing Aug. 24, 2010.

(Continued)

*Primary Examiner* — Zandra Smith
*Assistant Examiner* — Khanh Duong
(74) *Attorney, Agent, or Firm* — Westerman, Hattori, Daniels & Adrian, LLP

(57) ABSTRACT

The method for filling a liquid material, and the apparatus and the program make it possible, without changing a moving speed of an ejection device, to correct a change in ejection amount and to stabilize an application shape. The method fills a liquid material into a gap between a substrate and a work by using the capillary action. The method includes the steps of: generating an application pattern consisting of a plurality of application areas continuous to one another; assigning a plurality of ejection cycles, each obtained by combining the number of ejection pulses and the number of pause pulses at a predetermined ratio therebetween, to each of the application areas; and measuring an ejection amount at correction intervals and calculating a correction amount for the ejection amount.

10 Claims, 9 Drawing Sheets

(56) References Cited

U.S. PATENT DOCUMENTS

| | | |
|---|---|---|
| 2011/0042478 A1 | 2/2011 | Ikushima |
| 2011/0048575 A1 | 3/2011 | Abernathy et al. |
| 2011/0184569 A1 | 7/2011 | Abernathy et al. |
| 2012/0313276 A1* | 12/2012 | Ikushima .................. 264/40.1 |

FOREIGN PATENT DOCUMENTS

| | | |
|---|---|---|
| WO | 2008/053952 A1 | 5/2008 |
| WO | 2008/053953 A1 | 5/2008 |
| WO | 2008/096721 A1 | 8/2008 |
| WO | 2009/044524 A1 | 4/2009 |
| WO | 2009/104383 A1 | 8/2009 |

OTHER PUBLICATIONS

European Search Report dated Sep. 6, 2013, issued in corresponding European Patent Application No. 10789427.

* cited by examiner

1

METHOD FOR APPLYING LIQUID MATERIAL UTILIZING CAPILLARY PHENOMENON

TECHNICAL FIELD

The present invention relates to a method for filling a liquid material, which is ejected from an ejection device, into a gap between a substrate and a work placed on the substrate by utilizing a capillary action, and to a program adapted for the method. More particularly, the present invention relates to a method capable of, in an underfilling process for semiconductor packaging, compensating for a change in ejection amount of the liquid material and stabilizing the shape of the applied liquid material without changing a moving speed of the ejection device, and to a program adapted for the method.

BACKGROUND ART

There is the so-called flip-chip process as one of mounting techniques for semiconductor chips. In the flip-chip process, protrusive electrodes are formed on the surface of a semiconductor chip, and the protrusive electrodes are directly connected to electrode pads on a substrate.

In a flip-chip package, a resin 4 is filled into a gap between a semiconductor chip 1 and a substrate 2 to reinforce a connecting portion 3 therebetween in order to prevent stresses, which are generated due to the difference in thermal expansion coefficient between the semiconductor chip 1 and the substrate 2, from being concentrated on the connecting portion 3 and from damaging the connecting portion 3. Such a process is called an underfilling process (see FIG. 1).

The underfilling process is carried out by applying a liquid resin along an outer periphery of the semiconductor chip, filling the resin into a gap between the semiconductor chip and the substrate by utilizing a capillary action, and then heating the filled resin in, e.g., an oven to cure the resin.

In the underfilling process, a change in viscosity of the resin material with the lapse of time has to be taken into consideration. The reason is that, when the viscosity increases, an ejection amount of the liquid material through a material ejection port is reduced and the capillary action is insufficiently developed, thus giving rise to a problem that the liquid material is not filled in a proper amount into the gap. In the case of some material causing a large change in viscosity, the ejection amount is reduced, e.g., 10% or more after the lapse of six hours. It is hence required to compensate for the change in the ejection amount, which is caused depending on the viscosity change with the lapse of time.

Generally, a dispenser is used to fill the resin material in the underfilling process. One type of such a dispenser is a jet dispenser that ejects small droplets of the liquid material in a jet stream from a nozzle.

A method of carrying out the underfilling process by using the jet dispenser is disclosed in Japanese Patent Laid-Open Publication No. 2004-344883 (Patent Document 1), for example. In more detail, Patent Document 1 discloses a method for ejecting a viscous material onto a substrate by using a jet dispenser, the method including the steps of preparing a total volume of the viscous material to be ejected and a length over which the total volume of the viscous material is to be ejected, performing an operation to apply a plurality of viscous material droplets onto a weight gauge, generating a feedback signal representative of the weight of the plural viscous material droplets applied onto the weight gauge, and determining a maximum relative speed between the dispenser and the substrate such that the total volume of the viscous material is ejected over the aforementioned length.

The method disclosed in Patent Document 1 further includes the steps of determining respective volumes of the liquid material droplets, determining a total number of droplets required to provide a volume that is substantially equal to the aforementioned total volume, determining a distance between the droplets, which distance is required to substantially evenly distribute the viscous material droplets over the aforementioned length, and determining a rate value at which the viscous material droplets are ejected from the dispenser in order to eject the total volume of viscous material over the aforementioned length at a maximum relative speed.

PRIOR ART LIST

Patent Document

Patent Document 1: Japanese Patent Laid-Open Publication No. 2004-344883

SUMMARY OF THE INVENTION

Problems to be Solved by the Invention

Patent Document 1 discloses the method for evenly ejecting the viscous material droplets over the predetermined length, but it still has a room for improvement from the viewpoint described below.

In the jet dispenser, one droplet of the liquid material is ejected with an operation of one cycle consisting of an on-state where a piston disposed within the dispenser is elevated to open a valve seat, and an off-state where the piston is lowered to close the valve seat. Further, to apply the liquid material along a line by using the jet dispenser, the above-mentioned cycle is repeated at a certain interval while the jet dispenser is moved at a constant speed.

However, when the liquid material is applied along an outer periphery of a chip, i.e., along a line in an L-shape, a U-shape, or the like having a corner, the speed of the dispenser has to be reduced at the corner to change a moving direction of the dispenser. Accordingly, if the liquid material is ejected at a constant cycle, a pool of the liquid material is generated at the corner and a fillet, i.e., a portion of the liquid material extending off the chip, cannot be formed in a constant width. Further, in the underfilling process, even when the liquid material is applied along a line having no corners, the fillet is fatted or narrowed midway the line depending on a difference in penetration speed of the liquid material into gaps. Hence, the applied liquid material cannot be formed at the constant width.

In view of the problems described above, an object of the present invention is to provide a method for filling a liquid material, which can compensate for a change in ejection amount of a liquid material and can stabilize the shape of the applied liquid material without changing a moving speed of an ejection device, as well as to an apparatus and a program adapted for the method.

Means for Solving the Problems

One conceivable solution to overcome the problems described above is to change the speed of the dispenser at the above-mentioned corner or a portion where the penetration speed differs from that in the other portion. However, such a solution is difficult to employ in practice because an abrupt change in acceleration due to the speed change imposes a large mechanical burden and brings about the cause of generating vibrations.

In relation to a prior-art method for carrying out the underfilling process as in the above-cited Patent Document 1, the inventor has previously invented a novel method of correcting an ejection amount by adjusting the number of pulses. The novel method is an application method of preparing a desired application pattern, ejecting a liquid material from a nozzle while the nozzle and a work are moved relative to each other, and applying a specified ejection amount of the liquid material to the work, the method including an initial parameter setting step of specifying, as a total pulse number, the number of times at which ejection pulse signals and pause pulse signals are transmitted, specifying, of the total pulse number, the number of ejection pulse signals required to achieve the specified ejection amount, and specifying the rest number as the pause pulse signals, a correction amount calculating step of measuring, at a preset correction cycle, an ejection amount of the liquid material ejected from the nozzle at timing corresponding to the correction cycle, and calculating a correction amount for the ejection amount, and an ejection amount correcting step of adjusting the number of ejection pulse signals and the number of pause pulse signals on the basis of the correction amount calculated in the correction amount calculating step. Preferably, in the ejection amount correcting step, the ejection amount is corrected without changing a frequency (e.g., several tens hertz to several hundreds hertz) at which the ejection pulse signals and the pause pulse signals are transmitted.

In the above-described method, the application pattern is formed by cyclically transmitting the pulse signals in which the number of ejection pulses and the number of pause pulses are set at a predetermined ratio. However, when the correction is executed and the ratio between the numbers of both the pulse signals is changed, there may occur the case that the end of the cycle in combination of the ejection pulses and the pause pulses is not properly matched with the end of the application pattern for the reason that the length of the application pattern and an application speed (replaceable with an application time) are not changed. For example, if the end of the cycle is set to the state of the pause pulse in the case where the ejection pulse is to be transmitted at the end of the application pattern, a slight deviation occurs in the ejection amount.

The present invention provides technical means for correcting the ejection amount by setting a plurality of ejection cycles and adjusting a position at which the ejection cycles are switched over from one to another.

According to a first aspect of the present invention, there is provided a method for filling a liquid material, which is ejected from an ejection device, into a gap between a substrate and a work placed on the substrate by utilizing a capillary action, the method comprising a step of preparing an application pattern made up of a plurality of successive application regions, an ejection cycle assigning step of assigning a plurality of ejection cycles, in each of which the number of ejection pulses and the number of pause pulses are combined at a predetermined ratio, to each of the application regions, a correction amount calculating step of measuring, at a preset correction cycle, an ejection amount of the liquid material from the ejection device at timing of the correction cycle, and calculating a correction amount for the ejection amount, and an ejection amount correcting step including a step of adjusting the number of ejection pulses and the number of pause pulses, which are included in the application pattern, on the basis of the correction amount calculated in the correction amount calculating step, and/or a step of adjusting at least a length of one of the application regions and a length of another one or other two application regions, which are present continuously to the one application region, without changing the ejection amount per unit time in the individual application regions.

According to a second aspect of the present invention, in the ejection cycle assigning step in the filling method according to the first aspect, the ejection cycle includes respective ones of the ejection cycles assigned to the plurality of application regions.

According to a third aspect of the present invention, in the correction amount calculating step in the filling method according to the first or second aspect, the correction amount for the ejection amount is calculated on the basis of a differential value between a value obtained by measuring weight of the liquid material ejected for a certain time and a theoretical value of the weight of the liquid material ejected for the certain time.

According to a fourth aspect of the present invention, in the correction amount calculating step in the filling method according to the first or second aspect, the correction amount for the ejection amount is calculated on the basis of a value obtained by measuring weight of the liquid material ejected for a certain time, a theoretical value of the weight of the liquid material ejected for the certain time, the respective lengths of the individual application regions, and, assuming the ejection amount in arbitrary one of the application regions to be a reference amount, a proportion of the ejection amount in other one or two application regions, which are present continuously to the one application region, with respect to the reference amount.

According to a fifth aspect of the present invention, in the ejection amount correcting step in the filling method according to any one of the first to fourth aspects, the ejection amount is corrected without changing a frequency at which the ejection pulses and the pause pulses are transmitted.

According to a sixth aspect of the present invention, in the filling method according to any one of the first to fifth aspects, an allowable range used for determining whether correction is to be executed is set in a step prior to the correction amount calculating step, and when the differential value or the change rate exceeds allowable range, the correction is executed.

According to a seventh aspect of the present invention, in the filling method according to any one of the first to sixth aspects, the correction cycle is set on the basis of time information, the number of works, or the number of substrates, which is input as the correction cycle by a user.

According to an eighth aspect of the present invention, in the ejection amount correcting step in the filling method according to any one of the first to seventh aspects, the ejection amount is corrected without changing a relative moving speed between the ejection device and the work and a total length of the application pattern.

According to a ninth aspect of the present invention, there is provided an application apparatus comprising a liquid supply unit for supplying a liquid material, an ejection device having an ejection port through which the liquid material is ejected, a weighing unit for measuring an amount of the liquid material ejected through the ejection port, a driving unit for relatively moving the ejection port and a work, and a control unit for controlling operations of the aforesaid components, wherein the control unit performs the filling method according to any one of the first to eighth aspects.

According to a tenth aspect of the present invention, there is provided a program for, in an application apparatus comprising a liquid supply unit for supplying a liquid material, an ejection device having an ejection port through which the liquid material is ejected, a weighing unit for measuring an amount of the liquid material ejected through the ejection port, a driving unit for relatively moving the ejection port and a work, and a control unit for controlling operations of the aforesaid components, causing the control unit to perform the filling method according to any one of the first to eighth aspects.

Advantageous Effects of the Invention

With the present invention, since the application pattern can be prepared without being limited to an operation of evenly ejecting the liquid material along the work (chip), the liquid material can be applied in a manner adaptable for differences in the shape of the work, the penetration speed of the liquid material, etc., thus enabling a fillet to be formed in a constant width.

Also, since the application amount can be corrected without changing the relative moving speed, a mechanical burden and generation of vibrations can be suppressed.

Further, since one application pattern includes the plurality of ejection cycles, one application pattern can be formed by combining the plurality of ejection cycles for realizing different ejection amounts, and hence the desired application amount can be finely set.

The ejection amount correcting step in the present invention is simpler in procedures than the case of executing the correction for each liquid droplet, and is less apt to cause an error with calculations. Moreover, since the application amount can be corrected without changing the relative moving speed between the nozzle and the work, the application length, and the frequency of the pulse signal, control for realizing the desired application amount is easy to perform and the correction can be executed with higher accuracy than the prior art.

In addition, since the correction with the adjustment of the ejection cycle switching position enables the application amount to be corrected without changing the ejection amount per unit time, the supply amount (ejection amount) of the liquid material from the ejection device is not changed with respect to the amount of the liquid material penetrating into the gap between before and after the correction. Hence, a fillet can be always formed in a constant width.

MODE FOR CARRYING OUT THE INVENTION

One example of the mode for carrying out the present invention will be described with reference to FIGS. 2 and 3.

[1] Preparation of Application Pattern

An application pattern for linearly applying a liquid material is prepared in consideration of, e.g., an application amount and an application length which are determined depending on the shape of a work (chip). Here, the term "application amount" implies an amount of liquid material required for the application pattern, and the term "application length" implies a total length through which a nozzle and the work are moved relative to each other.

The application pattern is made up of a plurality of successive "application regions". A plurality of pulse combinations (hereinafter referred to as "ejection cycles"), in each of which the number of ejection pulses and the number of pause pulses are combined at a predetermined ratio, are prepared for individual application regions. The liquid material is ejected corresponding to the plural ejection cycles.

Figure 1:
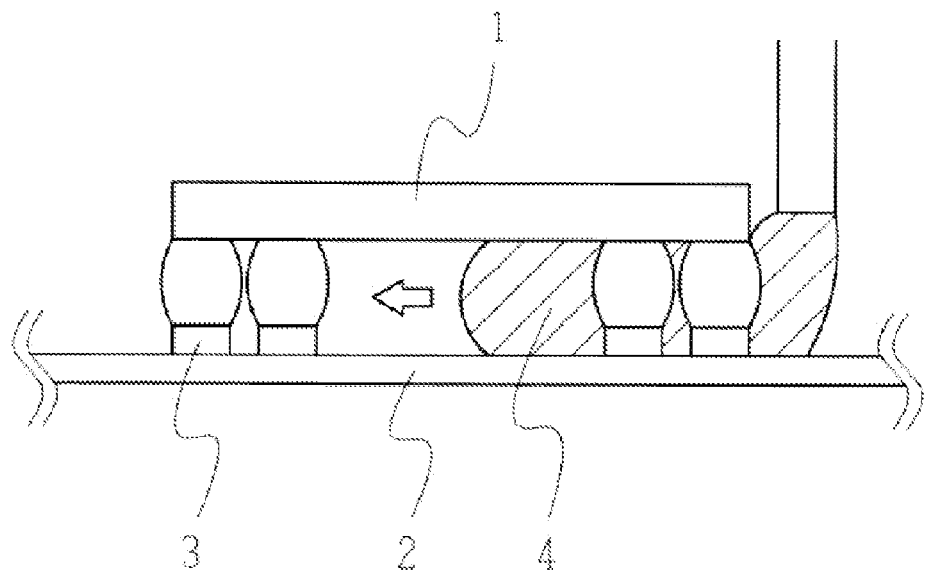
FIG. 1 is a side sectional view to explain an underfilling process.
Figure 2:
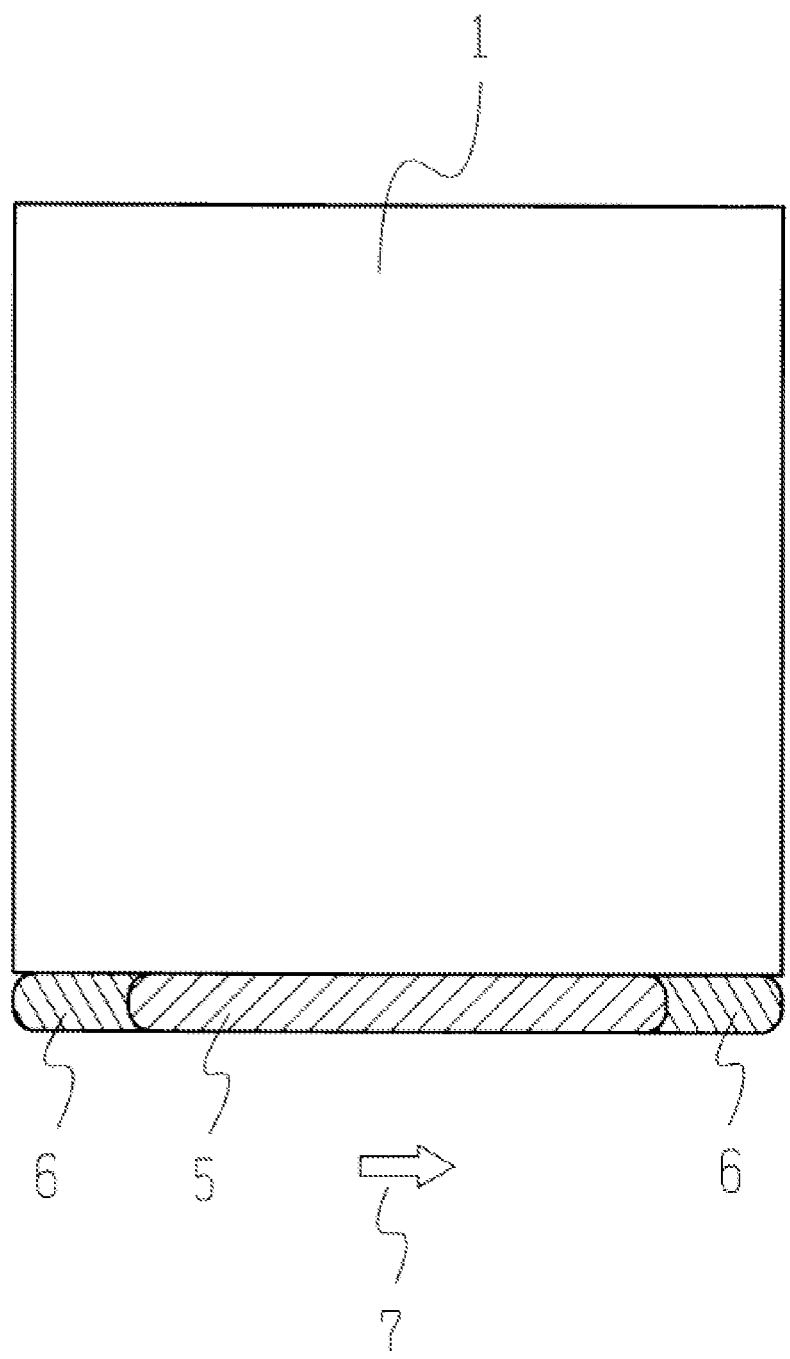
FIG. 2 is an explanatory view illustrating an example of an application pattern.
Figure 3:
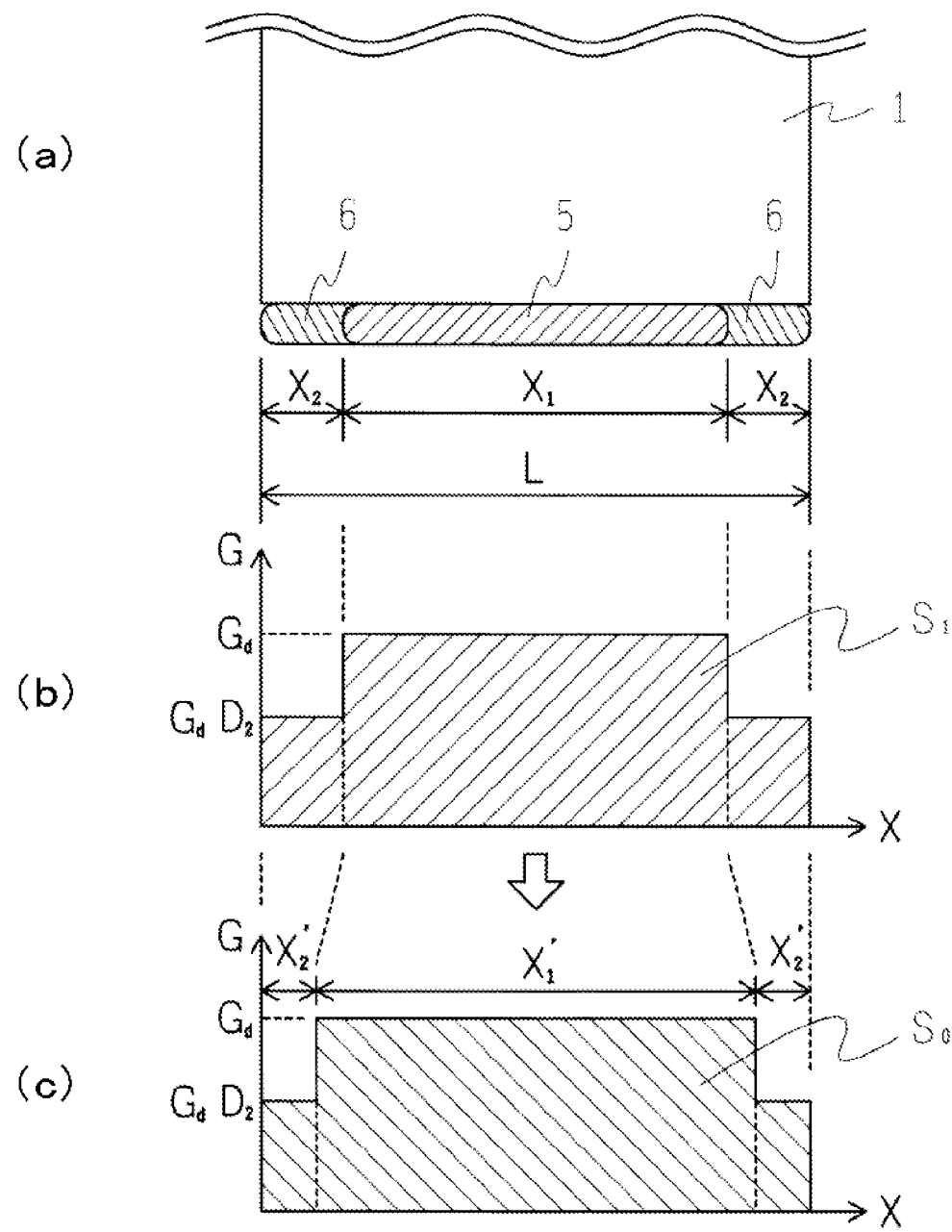
FIG. 3 is an explanatory view to explain calculation of a correction amount.

FIG. 2 illustrates one application pattern constituted as follows. A first ejection cycle including the ejection pulses and the pause pulses combined at a first ratio, and a second ejection cycle including the ejection pulses and the pause pulses combined at a second ratio are prepared. One first application region 5 in which the liquid material is ejected corresponding to the first ejection cycle is connected at opposite ends thereof with two second application regions 6 and 6 in which the liquid material is ejected corresponding to the second ejection cycle, whereby the one application pattern is constituted.

While, in the example of FIG. 2, the application regions 6 and 6 correspond to the second ejection cycle, the mode of the present invention is not limited to that example. One application region 6 may correspond to the second ejection cycle, and the other application region 6 may correspond to a third ejection cycle. The number of application regions assigned to one ejection cycle can be optionally set.

First, the application amount, i.e., the amount (weight or volume) of the liquid material, required for the desired application pattern is determined. Next, respective lengths of the first application region 5 and the second application region 6 are designed on the basis of the application amount. The combination ratio of the two types of pulses in each of the first application region 5 and the second application region 6 is determined depending on, for example, whether the application pattern has a corner, or on the extent of a penetration speed of the liquid material into a gap. As a result, the liquid material can be stably applied in a constant width without changing a moving speed of the nozzle.

It is to be noted that the mode of the present invention is not limited to the application of the liquid material along one side of the chip, and the liquid material may be applied along two sides, three sides, or an entire periphery of the chip. Also, the work is not limited to a rectangular one, and it may have a circular or polygonal shape.

Pulse signals made up of the ejection pulses and the pause pulses are transmitted at a predetermined frequency. In principle, the frequency and the number of shots per second are equal to each other. The frequency is preferably several tens hertz or higher, and more preferably several hundreds hertz.

[2] Setting of Initial Parameters

The number of ejection pulses and the number of pause pulses are set as initial parameters per ejection cycle. A setting table specifying combinations of the number of ejection pulses and the number of pause pulses is stored in a control unit in advance. A manner of setting the number of ejection pulses and the number of pause pulses for one ejection cycle will be described below.

Table 1 represents one example of the setting table stored in the control unit. In Table 1, a setting example A indicates a setting example of the ejection amount when the total pulse number is 100, a setting example B indicates a setting example of the ejection amount when the total pulse number is 111, and a setting example C indicates a setting example of the ejection amount when the total pulse number is 125. In each of the setting examples A, B and C, the number of ejection pulses corresponds to the ejection amount, and an adjustment of the ejection amount based on an adjustment of the pulse number can be performed by increasing or decreasing the number of pause pulses in the total pulse number.

The setting example A specifies individual setting examples for changing the ejection amount on the basis of a combination in which the pause pulse is not set for every ejection pulse (i.e., the number of pause pulses is 0) when the number of ejection pulses is 100.

The setting example B specifies individual setting examples for changing the ejection amount on the basis of a combination in which one pause pulse is set for every nine ejection pulses (i.e., the number of pause pulses is 11) when the number of ejection pulses is 100.

The setting example C specifies individual setting examples for changing the ejection amount on the basis of a combination in which one pause pulse is set for every four ejection pulses (i.e., the number of pause pulses is 25) when the number of ejection pulses is 100.

comparison with that in the second application region 6, the combination of one pause pulse per four ejection pulses (i.e., 80% ejection) and the combination of one pause pulse per three ejection pulses (i.e., 75% ejection) are selected from the setting examples A and are set respectively for the first application region 5 and the second application region 6.

[3] Setting of Correction Cycle

The correction cycle, i.e., the cycle of correcting the ejection amount, is set. For example, time information or the number of chips or substrates, which is input by a user, is set as the correction cycle. When a predetermined time is set, it is set as a period from the start of the operation to a time at which a change in the ejection amount of the liquid material is estimated to exceed an allowable range. When the number of chips or substrates is set, the number of chips or substrates capable of being processed is determined and set from both a time required for processing one chip or a time required for processing one substrate (i.e., a time required for carrying-in, application and carrying-out for each chip or substrate) and the above-mentioned predetermined time.

When setting the correction cycle, preferably, the relationships between the application pattern and proper weight and/or a proper ejection time are previously calculated with tests for the liquid material to be applied, and values of those parameters are reflected on the correction cycle. Although

TABLE 1

| A | | B | | C | | | |
|---|---|---|---|---|---|---|---|
| Number of ejection pulses | Number of pause pulses | Number of ejection pulses | Number of pause pulses | Number of ejection pulses | Number of pause pulses | Number of ejection pulses | Number of pause pulses |
| 1 | 0 | 100 | 0 | 111 | 0 | 125 | 0 |
| 10 | 1 | 91 | 9 | 101 | 10 | 114 | 11 |
| 9 | 1 | 90 | 10 | 100 | 11 | 113 | 12 |
| 8 | 1 | 89 | 11 | 99 | 12 | 111 | 14 |
| 7 | 1 | 88 | 12 | 98 | 13 | 110 | 15 |
| 6 | 1 | 86 | 14 | 96 | 15 | 108 | 17 |
| 5 | 1 | 83 | 17 | 92 | 19 | 104 | 21 |
| 4 | 1 | 80 | 20 | 89 | 22 | 100 | 25 |
| 3 | 1 | 75 | 25 | 83 | 28 | 94 | 31 |
| 2 | 1 | 67 | 33 | 74 | 37 | 84 | 41 |
| 1 | 1 | 50 | 50 | 56 | 55 | 63 | 62 |

When the number of pause pulses is increased, or when the number of pause pulses is increased or decreased in correction of the ejection amount with the later-described adjustment of the pulse number, the initial parameters are preferably set such that timings of the pause pulses occur at equal intervals.

When setting the initial parameters, the adjustment is preferably started from the combination in which one or more pause pulses are included, instead of starting from the combination in which no pause pulses are included (i.e., the combination in which the number of pause pulses is zero (=0)). In other words, when the parameters are set such that one or more pause pulses are included in the combination, it is possible to be adapted for both the case where the ejection amount is to be increased and the case where the ejection amount is to be decreased.

When setting the combination of the ejection pulses and the pause pulses, the desired combination of the ejection pulses and the pause pulses is selected from the stored setting table depending on the ejection amount that is required for the desired application pattern. Considering the application pattern illustrated in FIG. 2, for example, when the ejection amount in the first application region 5 is to be increased in there are influences of a change in viscosity of the liquid material caused by a temperature change, clogging in an ejection unit, and the water head difference, it is possible to be adapted for various kinds of changes in the ejection amount by specifying the above-mentioned parameters.

Further, as a limit value for a usable time of the liquid material, a value calculated on the basis of the pot life specified by a maker of the liquid material may be stored in advance and incorporated in the correction cycle.

When setting the correction cycle, a change in viscosity of the liquid material caused with the lapse of time and a temperature change requires to be taken into consideration. However, the following description is made on the premise that only the viscosity change is generated with the lapse of time.

It is needless to say that a known technique for controlling the viscosity of the liquid material with a temperature adjustment of the ejection unit can also be used in a combined manner when carrying out the present invention.

[4] Calculation of Correction Amount

The correction amount to be adapted for the change in the ejection amount caused by the viscosity change of the liquid material is calculated at the set correction cycle.

As methods for calculating the correction amount, there are (A) a method of measuring the weight of the liquid material when it is ejected for a certain time, and calculating the correction amount on the basis of the difference between the measured weight and the proper weight, and (B) a method of measuring an ejection time taken to reach the proper weight, and calculating the correction amount on the basis of the difference between the measured ejection time and the ejection time immediately preceding the former. While any of those methods can be employed in the present invention, the following description is made on practical procedures for calculating the correction amount in accordance with the method (A).

[i] Adjustment of Pulse Number

First, the nozzle (i.e., the ejection device) is moved to a position above a weight gauge, and the liquid material is ejected while the nozzle is fixedly held at that position. The ejection of the liquid material onto the weight gauge is continuously performed for the calculated proper ejection time. The proper ejection time is calculated from the proper ejection amount that is obtained when the liquid material is ejected at a proper application speed over a proper application length according to the initial setting parameters including the ejection pulses and the pause pulses.

Then, weight $G_1$ of the liquid material ejected onto the weight gauge is read. A current ejection amount $V_t$ in the relevant correction cycle is known by calculating a change rate R ($=(G_1-G_0)/G_0 \times 100$) from the measured weight $G_1$ and proper weight $G_0$. When the change rate R is minus, this means that the ejection amount $V_t$ in the proper ejection time is smaller than the proper weight. Therefore, the setting taking into account an increase of the ejection amount corresponding to the change rate R is selected from the setting table that is stored in the control unit, and the respective numbers of ejection pulses and pause pulses after the correction are set. Conversely, when the change rate R is plus, this means that the ejection amount $V_t$ in the proper ejection time is larger than the proper weight. Therefore, the setting taking into account a decrease of the ejection amount corresponding to the change rate R is selected from the setting table that is stored in the control unit, and the respective numbers of ejection pulses and pause pulses after the correction are set.

The measurement of the weight may be performed by measuring the weight plural times and determining a mean value. By determining the mean value, the measured value can be obtained with higher accuracy.

[ii] Adjustment of Ejection Cycle Switching Position

The ejection amount can also be corrected by adjusting the position, at which the plural ejection cycles set in the above-described [1] are switched over from one to another, in combination with the adjustment of the pulse number described in above [i] or solely. Here, the term "adjustment of ejection cycle switching position" implies an adjustment in which the length of the application region corresponding to one ejection cycle and the length of the application region corresponding to another one or other plural ejection cycles are adjusted without changing the ejection amount per unit time in each ejection cycle. The adjustment of the ejection cycle switching position enables the correction to be more finely performed than the correction in above [i]. Thus, accuracy of the correction can be further improved by executing the adjustment of the ejection cycle switching position solely or successively after executing the correction in above [i]. The reason is that the adjustment of the pulse number performs the correction in a digital manner and it may generate a portion where a deviation occurs, while the adjustment of the ejection cycle switching position performs the correction in an analog manner without causing a deviation even for such a portion.

Details will be described below with reference to FIG. 3 in connection with the above-described example illustrated in FIG. 2.

In advance, the weight of the ejected liquid material is measured in a similar manner to that described in above [i]. As described later in explanation of correction procedures, the result obtained in above [i] may be used as it is without performing the measurement again, or the weight may be measured again.

Firstly, ejection weight $G_d$ per unit length is determined from the measured weight (measured application amount) $G_1$. The measured weight $G_1$ corresponds to an area of a convex portion $S_1$ hatched in a graph of FIG. 3(b). In more detail, the area of the convex portion $S_1$ is given by the sum of an area of a portion (corresponding to the reference symbol 5), which is equivalently resulted from multiplying the ejection weight $G_d$ per unit length in the first application region by a length $X_1$ of the first application region, and an area of a portion (corresponding to the reference symbol 6), which is equivalently resulted from multiplying ejection weight $G_d D_2$ per unit length in the second application region by a total length $(L-X_1)$ of the second application region. Herein, L is a total length of the application pattern, $X_1$ is a length of the first application region before the correction, and $D_2$ is a proportion of the ejection amount in the second application region on an assumption that the ejection amount in the first application region is 1. Accordingly, the measured weight $G_1$ is calculated from the following formula.

$$G_1 = X_1 G_d + (L-X_1) D_2 G_d \quad \text{[Formula 1]}$$

Hence, the ejection weight $G_d$ per unit length is calculated from the following formula.

$$G_d = \frac{G_1}{X_1 + (L-X_1)D_2} \quad \text{[Formula 2]}$$

Secondly, a length $X_1'$ of the first application region after the correction is determined on the basis of the ejection weight $G_d$ per unit length, which has been determined from the formulae 1 and 2, and of the proper weight (proper application amount) $G_0$ calculated from the following formula. It is assumed that the proper weight $G_0$ corresponds to an area $S_0$ of a convex portion hatched in a graph of FIG. 3(c). In such a case, the lengths of both the application regions need to be changed in order that the correction is made to eject the liquid material in the proper weight $G_0$ without changing the ejection weight $G_d$ per unit length and the proportion $D_2$ of the ejection amount in the second application region. Given that the length of the first application region after the change is $X_1'$, the proper weight $G_0$ is calculated by the following formula in a similar manner to that in the case of the above formula 1.

$$G_0 = X_1' G_d + (L-X_1') D_2 G_d \quad \text{[Formula 3]}$$

Hence, the length $X_1'$ of the first application region after the correction is calculated from the following formula.

$$X_1' = \frac{G_0}{G_d(1-D_2)} - \frac{LD_2}{1-D_2} \quad \text{[Formula 4]}$$

A length $X_2'$ of the second application region after the correction is obtained by subtracting the length $X_1'$ of the first application region after the correction from the total length L of the application pattern. In the example of FIG. 3, $X_2'$ is given by a half of a value resulting from subtracting the length $X_1'$ of the first application region after the correction from the total length L of the application pattern.

Finally, the application pattern obtained by changing to the respective lengths of the first application region and the second application region after the correction is set as a new application pattern.

As in the above-described case, the measurement of the weight may be performed by measuring the weight plural times and determining a mean value. By determining the mean value, the measured value can be obtained with higher accuracy.

[5] Execution of Correction

When it is determined in above [4] that the correction of the ejection amount is required, the correction is executed in accordance with the adjustment of the pulse number in above [i] and then the adjustment of the ejection cycle switching position in above [ii].

Here, the determination as to the necessity of the correction is preferably made such that the correction is executed only when the differential value of the measured ejection amount (i.e., the measured value) or the change rate exceeds an allowable range (e.g., ±5%), instead of executing the correction always when the weight difference or the change rate is not zero. Details of a preferred mode of the correction employing the allowable range are described in, for example, Japanese Patent No. 3877038 patented to the applicant. Thus, an allowable range for determining whether the correction is to be executed or not is set, and the application pattern is corrected only when the differential value or the change rate exceeds the allowable range.

As described above, by executing the steps of above [4] and [5] at the correction cycle set in above [3] or when the type (size or shape) of the substrate is changed, the optimum application amount can be always realized regardless of the change in viscosity of the liquid material with the lapse of time. Further, the correction in accordance with the adjustment of the pulse number in [i] of above [4] is adapted for correction of large extent and the correction in accordance with the adjustment of the ejection cycle switching position in [ii] of above [4] is adapted for correction of small extent. Therefore, the correction accuracy can be further improved by performing the adjustment in [1] of above [4] and then the adjustment in [ii] of above [4].

With the above-described correction according to the present invention, since ejection conditions (e.g., a stroke and a nozzle temperature) for deciding the ejection amount per shot are no longer required to be changed, calculations for the correction are simplified and the correction is free from the problem of a variation in the ejection amount, which is caused upon change of the ejection conditions. As a result, the correction can be executed with high predictability.

The present invention will be described below in connection with Examples, but the present invention is in no way restricted by the following Examples.

Example 1

Application Apparatus

Figure 4:
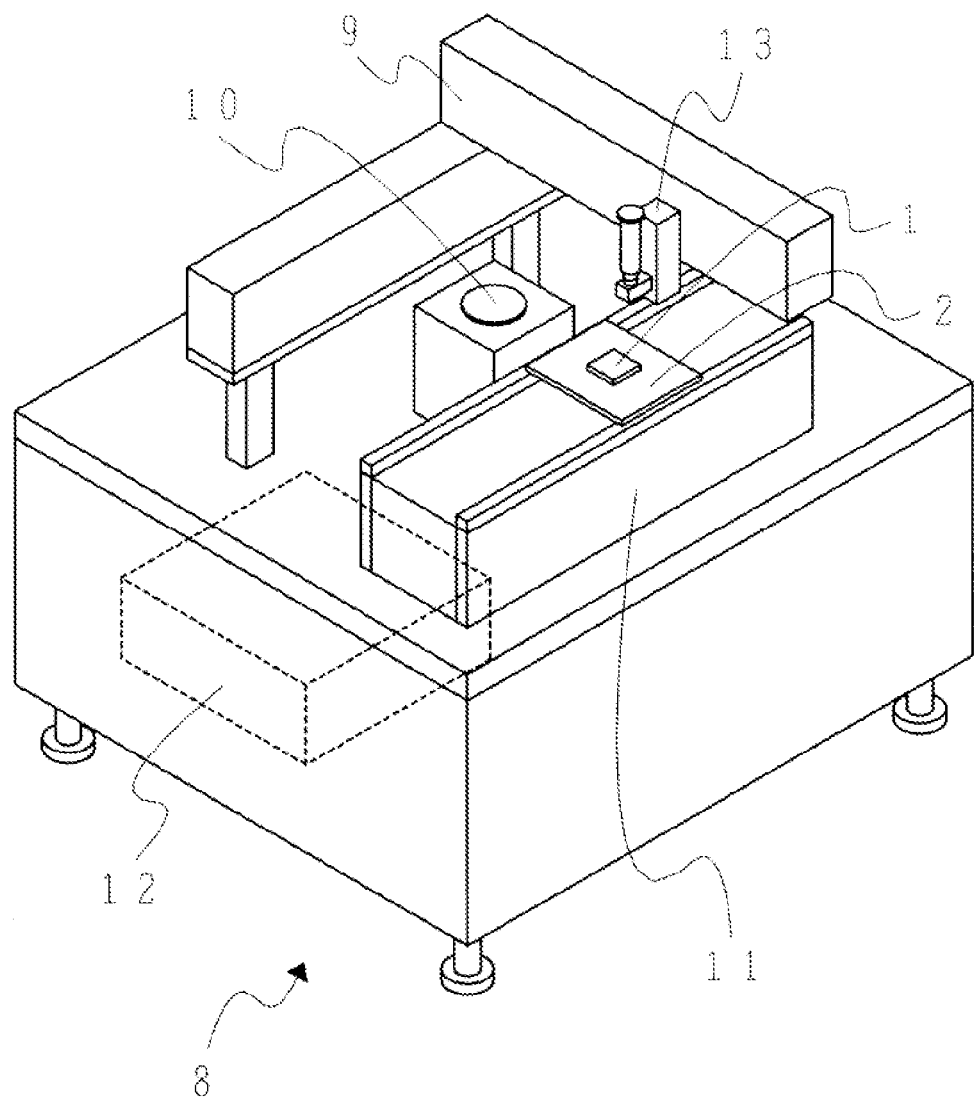
FIG. 4 is a schematic perspective view of an application apparatus according to Example 1.

An application apparatus 8 of Example 1 is, for example, an application apparatus for use in an underfilling process. As illustrated in FIG. 4, the application apparatus 8 includes an ejection device 13, an XY driving mechanism 9, a weight gauge 10 serving as a weighing unit, a conveying mechanism 11, and a control unit 12 for controlling operations of those components.

The ejection device 13 is of the jet type, and it includes a nozzle 17 for ejecting a liquid material 4 therethrough. The ejection device 13 is mounted to the XY driving mechanism 9 such that the ejection device 13 can be moved to a position above a substrate 2 and to a position above the weight gauge 10.

The XY driving mechanism 9 can be operated so as to apply the liquid material 4 in a desired pattern while it is moved in the XY directions above the substrate 2.

At the start of the application of the liquid material, the flip-chip mounted substrate 2 as an application target is first conveyed to a position under the ejection device 13 by the conveying mechanism 11.

The application by the ejection device 13 is started after the substrate 2 has been conveyed to a position under the nozzle 17 and the substrate 2 has been properly positioned. A path of the nozzle 17 during the application operation, i.e., a basic application pattern, is previously stored in, e.g., a memory inside the control unit 12.

After the end of the application, the substrate 2 is carried out to the outside of the application apparatus 8 by the conveying mechanism 11. Subsequently, the next substrate 2 is carried in and the application operation is repeated for the next substrate 2. Thus, the application operation is repeated through a series of steps of carrying-in, application, and carrying-out until the application is completed for the desired number of substrates 2.

During the repetition of the above-mentioned steps, the ejection amount is corrected at timing of the preset correction cycle. In other words, correction of the ejection amount, which has changed with a change in viscosity of the liquid material 4, is executed. Calculation of the correction amount is performed by moving the nozzle 17 to the position above the weight gauge 10 by the XY driving mechanism 9, and measuring the weight of the ejected liquid material 4 by the weight gauge 10. Details of correction procedures will be described later.

[2] Ejection Device

Figure 5:
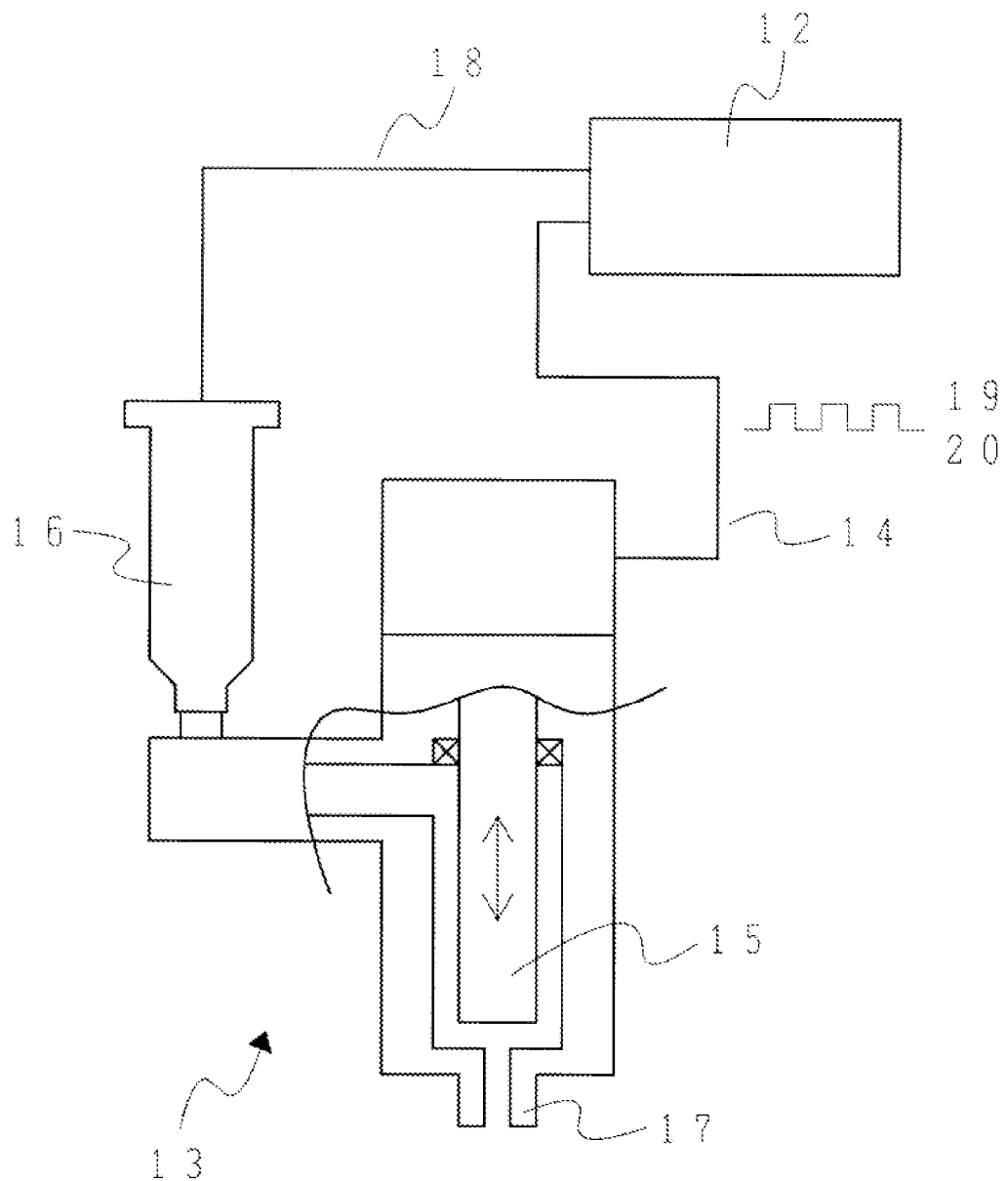
FIG. 5 is a schematic view, partly sectioned, of an ejection device according to Example 1.

As illustrated in FIG. 5, the ejection device 13 includes a piston 15 disposed inside the ejection device 13 to be able to move up and down, a reservoir 16 under pressure with a compressed gas supplied at a regulated pressure through a compressed-gas supply line 18, and the nozzle 17 communicating with the reservoir 16.

The liquid material 4 filled in the reservoir 16 is ejected in the form of liquid droplets from the nozzle 17 by moving the piston 15 up and down in accordance with a pulse signal (19, 20) that is transmitted from the control unit 12 through a pulse signal supply line 14. The liquid material 4 ejected from the nozzle 17 is applied onto, e.g., the substrate 2 or the weight gauge 10, which is positioned under the nozzle 17. The reservoir 16 is under pressure with the compressed gas that is supplied from the control unit 12 at the regulated pressure through the compressed-gas supply line 18.

The ejection device 13 reciprocates the piston 15 through one cycle and ejects one droplet of the liquid material 4 from the nozzle 17 in accordance with one pulse signal. In other words, a unit cycle in accordance with one pulse signal corresponds to one shot.

Figure 6:
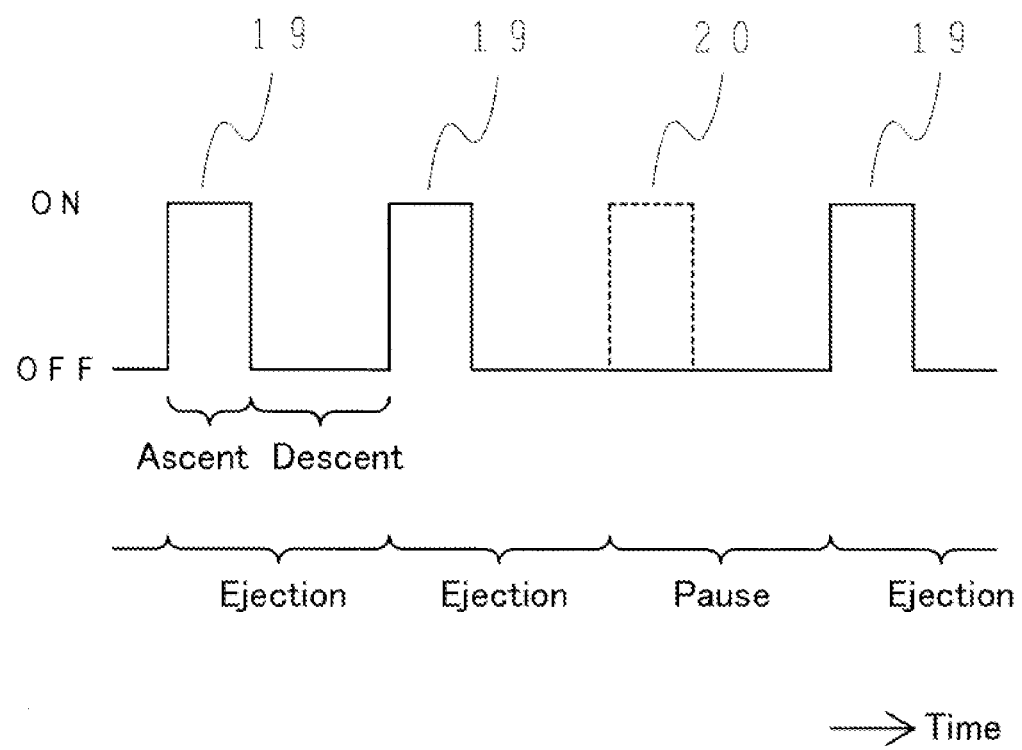
FIG. 6 is an explanatory view to explain pulse signals transmitted to the ejection device according to Example 1.

The pulse signal (19, 20) is provided, by way of example, as illustrated in FIG. 6 such that when the pulse signal is in an on-state, the piston 15 is ascended to open a nozzle port, and when the pulse signal then comes into an off-state, the piston 15 is descended to close the nozzle port. The ascent of the piston 15 (i.e., the opening of the nozzle port) and the descent of the piston 15 (i.e., the closing of the nozzle port) constitute the unit cycle, and one droplet of the liquid material is ejected with an operation in the unit cycle (see the reference symbol 19 in FIG. 6). On the other hand, when the pulse signal is in an off-state, the piston 15 is not operated and the nozzle port is closed during one unit cycle (see the reference symbol 20 in FIG. 6).

It is to be noted that an on-state time (ascent time) and an off-state time (descent time) within one unit cycle may be adjusted as required.

When the liquid material is applied along a side of a work, the control unit 12 transmits, upon the start of the application, the pulse signal (19, 20) to the ejection device 13 at a preset frequency while the nozzle 17 is moved, whereby the liquid material 4 is continuously ejected. The liquid material 4 ejected along the side of the work is filled into a gap between the work 1 and the substrate 2 with the capillary action.

The frequency of the pulse signal (19, 20) transmitted to the ejection device 13 is set on the basis of a mechanical response characteristic of the ejection device 13 and characteristics of the liquid material 4. Although the optimum frequency differs depending on the ejection amount, it is, e.g., about 100 to 200 hertz in many cases.

The ejection amount, etc. are changed with a change in the frequency. A change characteristic of the ejection amount depending on the change in the frequency is not linear, and the ejection of the liquid material is failed under some conditions. Accordingly, it is preferable not to change the once-set frequency when the ejection amount is corrected during the application operation using the same application pattern. Thus, this Example is featured in that the ejection amount is corrected by adjusting the ratio of the ejection pulses to the pause pulses, but the ejection amount is not corrected by changing the frequency of the pulse signal.

[3] Correction Procedures with Adjustment of Pulse Number

Figure 7:
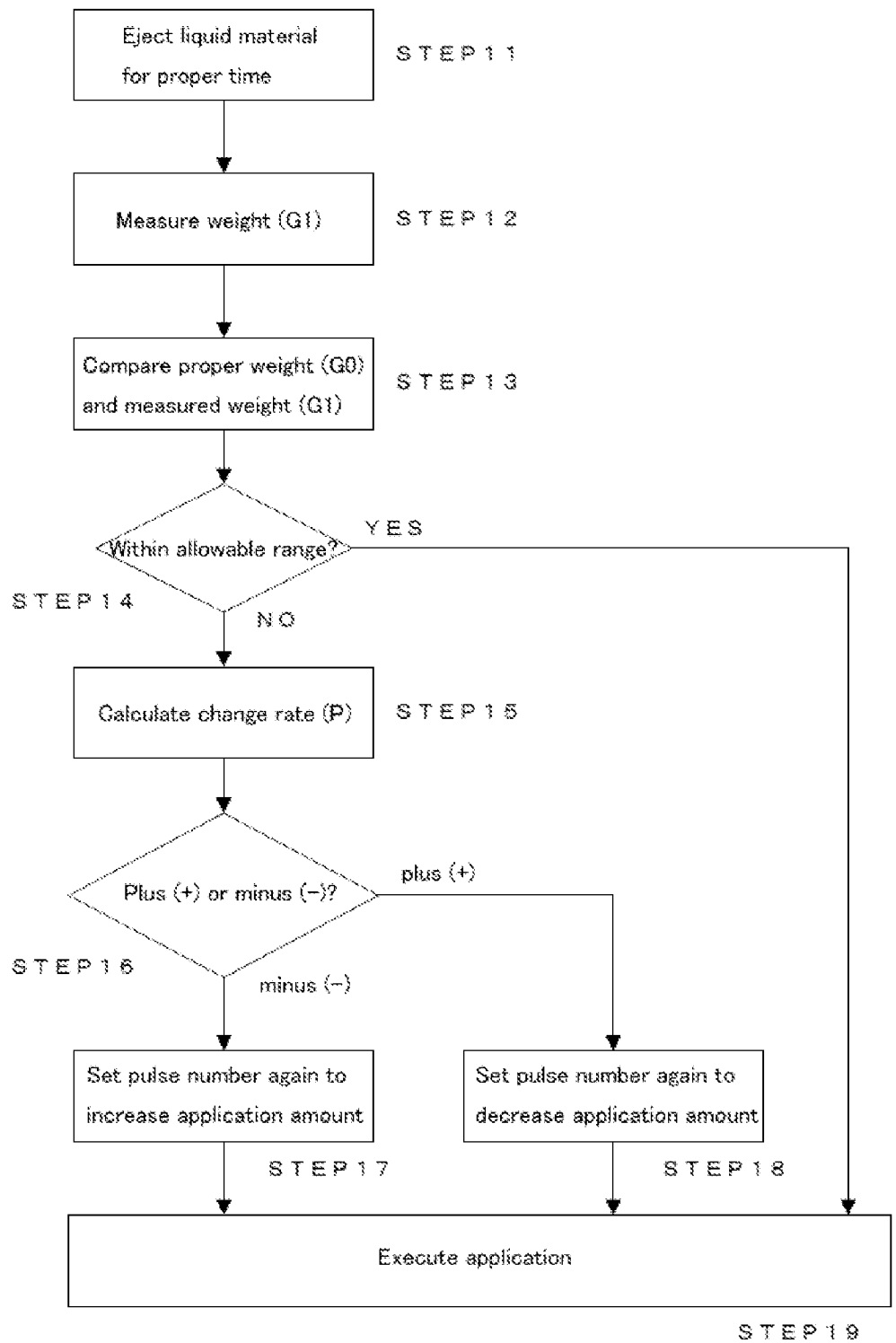
FIG. 7 is a flowchart to explain correction procedures with an adjustment of the pulse number.

FIG. 7 is a flowchart to explain correction procedures with the adjustment of the pulse number.

First, upon reaching the timing of the set correction cycle, the liquid material is ejected by transmitting a plurality of pulses, including ejection pulses and pause pulses, for a proper ejection time that is determined from the proper application length and the proper application speed (STEP 11). Next, the weight $G_1$ of the ejected liquid material is measured (STEP 12). Subsequently, the proper weight $G_0$ and the measured weight $G_1$ are compared with each other (STEP 13), and the necessity of the correction is determined depending on whether a weight difference therebetween exceeds the allowable range (STEP 14).

If it is determined in STEP 14 that the correction is required, the change rate R $(=(G_1-G_0)/G_0 \times 100)$ is calculated from the proper weight $G_0$ and the measured weight $G_1$ (STEP 15), and whether the change rate R is plus or minus is determined (STEP 16).

If the change rate R is minus, this means that the ejection amount is less than the proper weight. Therefore, the setting taking into account an increase of the ejection amount corresponding to the minus change rate is selected from the table stored in the control unit, and the respective numbers of ejection pulses and pause pulses are set again (STEP 17).

If the change rate R is plus, this means that the ejection amount is more than the proper weight. Therefore, the setting taking into account a decrease of the ejection amount corresponding to the plus change rate is selected from the table stored in the control unit, and the respective numbers of ejection pulses and pause pulses are set again (STEP 18). After the setting, the application of the liquid material is executed (STEP 19).

As a modification of the above-described correction procedures, the allowable range may be set in terms of the change rate instead of the weight difference, and the necessity of the correction may be determined on the basis of the change rate. In such a modification, STEP 14 is not executed and the determination as to the necessity of the correction is made between STEP 15 and STEP 16.

[4] Correction Procedures with Adjustment of Ejection Cycle Switching Position

Figure 8:
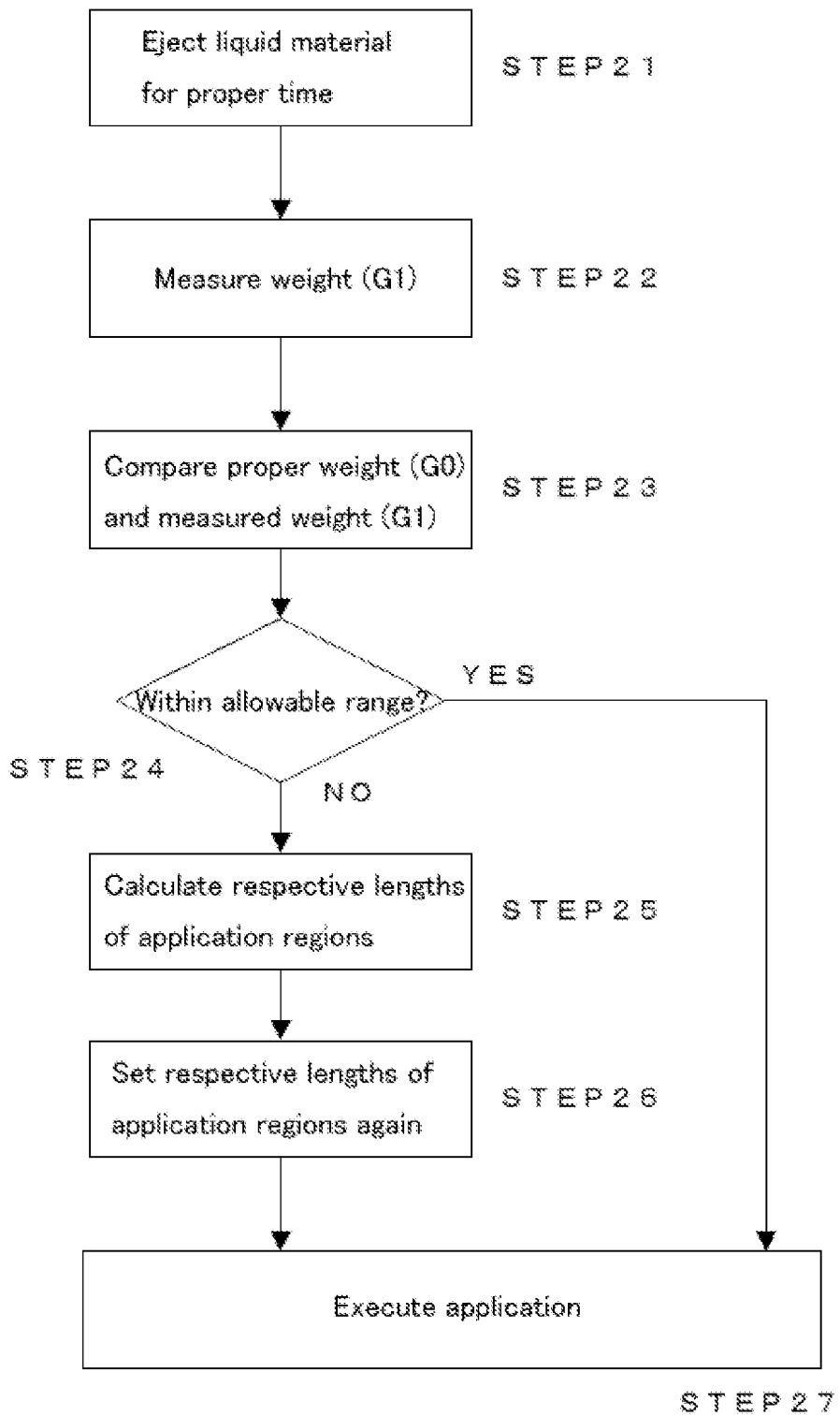
FIG. 8 is a flowchart to explain correction procedures with an adjustment of an ejection cycle switching position.

FIG. 8 is a flowchart to explain correction procedures with the adjustment of the ejection cycle switching position.

First, upon reaching the timing of the set correction cycle, the liquid material is ejected for the proper ejection time that is determined from the proper application length and the proper application speed (STEP 21). Next, the weight $G_1$ of the ejected liquid material is measured (STEP 22). Subsequently, the proper weight $G_0$ and the measured weight $G_1$ are compared with each other (STEP 23), and the necessity of the correction is determined depending on whether a weight difference therebetween exceeds the allowable range (STEP 24).

If it is determined in STEP 24 that the correction is required, respective lengths of plural application regions are calculated (STEP 25), and respective lengths of the application regions in the application pattern are set again on the basis of the calculated lengths (STEP 26). After the setting, the application of the liquid material is executed (STEP 27).

As a modification of the above-described correction procedures, the allowable range may be set in terms of any one of the lengths of the application regions instead of the weight difference, and the necessity of the correction may be determined with comparison of the length of the application region. In such a modification, STEP 24 is not executed and the determination as to the necessity of the correction is made between STEP 25 and STEP 26.

Further, the above-described correction procedures [3] and [4] may be executed in succession. By doing so, even when the correction is not completely executed with the correction procedures [3], the uncompleted correction can be covered by the correction procedures [4]. On the other hand, the results of STEP 11 to STEP 14 in above [3] may be utilized without executing the procedures from STEP 21 to STEP 24 in above [4]. As an alternative, the steps after STEP 25 in above [4] may be executed subsequently to STEP 18 in above [3]. Such a modification can shorten the time taken for the correction operation.

According to the above-described apparatus of this example, the adjustment can be performed with no need of considering the properties of the liquid material, etc. by previously storing the adjustment ratios (i.e., the setting table) that have been specified with calculations. Also, by switching over a plurality of different ejection cycles from one to another midway the application pattern, the shape of the fillet can be held in a stable state even when there are differences in the shape of the work and the penetration speed into the gap. Further, since the position, at which the plural different ejection cycles are switched from one to another, is adjusted in addition to the adjustment of the pulse number, the correction accuracy can be further improved and the liquid material can be ejected in a constant amount with higher accuracy.

Example 2

Modification of Calculation of Correction Amount

While, in the above-described embodiment, the length of each application region after the correction is calculated after determining the ejection weight $G_d$ per unit length, the length of each application region after the correction may be calculated from the number of times of ejections per unit time, the moving speed of the ejection device, and the ejection weight per shot. Such a modification will be described in detail below. It is to be noted that the application pattern is the same as that illustrated in FIG. 3.

First, the liquid material is ejected for the proper ejection time that is determined from the proper application length and the proper application speed, and the weight $G_1$ of the ejected liquid material is measured. An ejection amount w per shot is determined from the measured weight $G_1$. Assuming that the number of times $Y_1$ of ejections per unit time in the first application region, the number of times $Y_2$ of ejections per unit time in the second application region, and the moving speed V of the ejection device are known, the measured weight $G_1$ is calculated by the following formula.

$$G_1 = wY_1 \frac{X_1}{V} + wY_2 \frac{L - X_1}{V} \quad \text{[Formula 5]}$$

Here, L is the total length of the application pattern, and $X_1$ is the length of the first application region. Accordingly, the ejection amount w per shot is calculated by the following formula.

$$w = \frac{G_1 V}{X_1 Y + (L - X_1) Y_2} \quad \text{[Formula 6]}$$

When trying to eject the proper weight $G_0$ with the ejection amount w per shot without changing the numbers of times $Y_1$ and $Y_2$ of ejections per unit time in the first and second application regions, the length of each application region needs to be changed. Given that the length of the first application region after the correction is $X_1'$, the proper weight $G_0$ is expressed by the following formula.

$$G_0 = wY_1 \frac{X_1'}{V} + wY_2 \frac{L - X_1'}{V} \quad \text{[Formula 7]}$$

Accordingly, the length $X_1'$ of the first application region after the correction is calculated by the following formula.

$$X_1' = \frac{(G_0/w)V}{Y_1 - Y_2} - \frac{Y_2 L}{Y_1 - Y_2} \quad \text{[Formula 8]}$$

The following points are similar to those in the above-described embodiment. The length $X_2'$ of the second application region after the correction is obtained by subtracting the length $X_1'$ of the first application region after the correction from the total length L of the application pattern, and the application pattern obtained by changing to the respective lengths of the first application region and the second application region after the correction is set as a new application pattern.

When determining the ejection weight, the weight after ejecting the liquid material in the preset number of shots may be measured and the ejection amount per shot may be determined from the measured weight and the number of shots instead of using the formulae 5 and 6.

The measurement of the weight may be performed by measuring the weight plural times and determining a mean value. By determining the mean value, the measured value can be obtained with higher accuracy.

Example 3

Example 1 of Other Application Patterns

Figure 9:
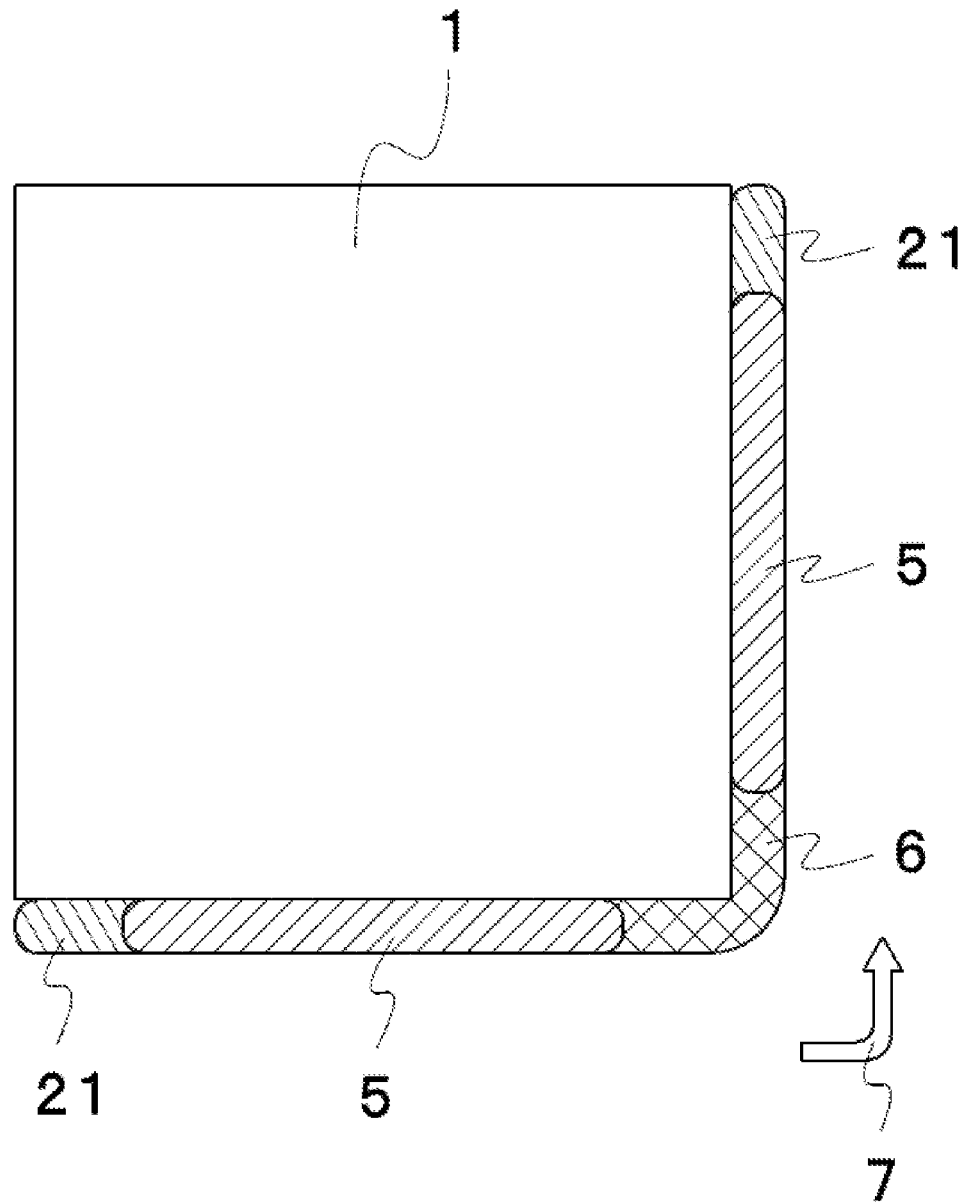
FIG. 9 is an explanatory view illustrating an example of an application pattern according to Example 3.

FIG. 9 illustrates an example of the application pattern when the liquid material is applied in an L-shape along an outer periphery of a work 1. In the example of FIG. 9, the first application region 5 is formed near a center of each of two sides of the work 1 along which the liquid material is to be applied, the second application region 6 is formed near a corner at which the two sides adjoin with each other, and a third application region 21 is formed in each of the two sides at the end opposite to the second application region 6. First to third ejection cycles correspond respectively to the first application region 5 to the third application region 21. In such a case, at the corner, a pool of the liquid material tends to generate because the liquid material penetrates into the gap from two directions and the moving direction of the nozzle is changed. In view of the above, the pool of the liquid material is prevented from being generated at the corner and the fillet can be formed in a constant width by setting the second ejection cycle as a combination of pulses providing a smaller ejection amount than that in the other ejection cycles. It is to be noted that the correction amount can be calculated by employing a similar calculation manner to that described above in Example 1 or 2.

In the case of FIG. 9, the adjustment of the ejection cycle switching position can be performed at plural positions. Regarding the position at which the adjustment is performed, however, an optimum position is decided, as appropriate, depending on the shape of the work 1, the mounted position of the work 1 on a substrate, the array density of protrusive electrodes (hereinafter referred to as "bumps"), etc. For example, when the bump array density at the switching position is changed in the adjustment of the ejection cycle switching position, the correction is preferably executed by selecting a region where the bump array density is not changed. In consideration of such a condition, the location where the application region is extended or contracted is decided such that the application form (i.e., the fillet shape) is not deformed. The correction amount is in principle calculated in units of one nozzle stroke (descent of nozzle application ascent of nozzle). However, the concept of the present invention can also be satisfactorily adapted for the case where the liquid material is applied to the same location several times in a superposing way (i.e., the case where the liquid material is applied with two or more nozzle strokes).

Example 4

Example 2 of Other Application Patterns

When the amount of the liquid material to be filled is small, such as when the work (chip) 1 is small, the application length is also short (generally, when the amount of the liquid material to be filled is small, the number of sides of the work as the application target is one in many cases). In that case, the correction amount is also mostly small. Therefore, the correction with the adjustment of the ejection cycle switching position described in [4] [ii] of the embodiment may be executed solely.

As described above, the correction with the "adjustment of the ejection cycle switching position" enables correction to be precisely executed. However, when the correction amount is large, the "adjustment of the ejection cycle switching position" cannot be said as an optimum means for the reason that a large difference has to be previously set between individual ejection cycles and hence the application shape (mainly a line width) is affected. On the other hand, when the correction amount is small, the correction with the "adjustment of the ejection cycle switching position" is sufficiently adaptable and it is rather preferable from the viewpoint of accuracy. Another advantage is that a time required for the correction is cut by solely executing the correction with the "adjustment of the ejection cycle switching position".

Procedures in this example are basically similar to the above-described procedures of measuring the ejection weight, determining the necessity of the correction, and when the correction is determined to be necessary, calculating the length of each application region, followed by setting the application pattern again. In other words, the procedures in this example are executed in accordance with the procedures described above in [4] [ii] of the embodiment, [4] of the Example 1 and the flowchart of "FIG. 8".

With this example, when the correction has been executed in accordance with the above-described procedures for an application pattern having a length of 1 cm, a satisfactory correction result has been obtained.

INDUSTRIAL APPLICABILITY

The present invention can be practiced in various types of devices for ejecting liquid materials. For example, the present invention can be practiced in an ejection device of the type in which the liquid material comes into contact with the work after having departed from the ejection device, such as the jet type striking a valve body against a valve seat, thereby causing the liquid material to be ejected in a way flying from the fore end of a nozzle, the plunger jet type moving a plunger-type plunger and then abruptly stopping the plunger, thereby causing the liquid material to be eject in a way flying from the fore end of a nozzle, and the ink jet type operating in a continuous jet mode or on demand.

LIST OF REFERENCE SYMBOLS 1 chip, work
2 substrate
3 connecting portion
4 resin, liquid material
5 first application region
6 second application region
7 applying direction
8 application apparatus
9 XY driving mechanism
10 weight gauge
11 conveying mechanism
12 control unit
13 ejection device
14 pulse signal supply line
15 piston
16 reservoir
17 nozzle
18 compressed-gas supply line
19 ejection pulse
20 pause pulse
21 third application region
L total length of application pattern
$X_1$ length of first application region
$X_2$ length of second application region
$X_1'$ length of first application region after correction
$X_2'$ length of second application region after correction
$D_2$ proportion of ejection amount in second application region when ejection amount in first application region is assumed to be 1

The invention claimed is:

1. A method for filling a liquid material, which is ejected from an ejection device, into a gap between a substrate and a workpiece placed on the substrate by utilizing a capillary phenomenon, the method comprising:
a step of preparing an application pattern made up of a plurality of successive application regions;
an ejection cycle assigning step of assigning a plurality of ejection cycles, in each of which the number of ejection pulses and the number of pause pulses are combined at a predetermined ratio, to each of the application regions;
a correction amount calculating step of measuring, at a preset correction cycle, an ejection amount of the liquid material ejected from the ejection device at timing of the correction cycle, and calculating a correction amount for the ejection amount; and
an ejection amount correcting step including a step of adjusting the number of ejection pulses and the number of pause pulses, which are included in the application pattern, on the basis of the correction amount calculated in the correction amount calculating step, and/or a step of adjusting at least a length of one of the application regions and a length of another one or other two application regions, which are present continuously to the one application region, without changing respective ejection amounts per unit time in the individual application regions.

2. The method for filling the liquid material according to claim 1, wherein, in the ejection cycle assigning step, the ejection cycle includes respective ones of the ejection cycles assigned to the plurality of application regions.

3. The method for filling the liquid material according to claim 1, wherein, in the correction amount calculating step, the correction amount for the ejection amount is calculated on the basis of a differential value between a value obtained by measuring weight of the liquid material ejected for a certain time and a theoretical value of the weight of the liquid material ejected for the certain time.

4. The method for filling the liquid material according to claim 1, wherein, in the correction amount calculating step, the correction amount for the ejection amount is calculated on the basis of a value obtained by measuring weight of the liquid material ejected for a certain time, a theoretical value of the weight of the liquid material ejected for the certain time, the respective lengths of the individual application regions, and, assuming the ejection amount in arbitrary one of the application regions to be a reference amount, a proportion of the ejection amount in other one or two application regions, which are present continuously to the one application region, with respect to the reference amount.

5. The method for filling the liquid material according to claim 1, wherein, in the ejection amount correcting step, the ejection amount is corrected without changing a frequency at which the ejection pulses and the pause pulses are transmitted.

6. The method for filling the liquid material according to claim 1, wherein an allowable range used for determining whether correction is to be executed is set in a step prior to the correction amount calculating step, and when the differential value or the change rate exceeds allowable range, the correction is executed.

7. The method for filling the liquid material according to claim 1, wherein the correction cycle is set on the basis of time information, the number of works, or the number of substrates, which is input as the correction cycle by a user.

8. The method for filling the liquid material according to claim 1, wherein, in the ejection amount correcting step, the ejection amount is corrected without changing a relative moving speed between the ejection device and the work and a total length of the application pattern.

9. An application apparatus comprising a liquid supply unit for supplying a liquid material, an ejection device having an ejection port through which the liquid material is ejected, a weighing unit for measuring an amount of the liquid material ejected through the ejection port, a driving unit for relatively moving the ejection port and a work, and a control unit for controlling operations of the aforesaid components, wherein the control unit performs the filling method according to claim 1.

10. A computer program product embedded in a computer-readable storage medium for, in an application apparatus comprising a liquid supply unit for supplying a liquid material, an ejection device having an ejection port through which the liquid material is ejected, a weighing unit for measuring an amount of the liquid material ejected through the ejection port, a driving unit for relatively moving the ejection port and a work, and a control unit for controlling operations of the aforesaid components, causing the control unit to perform the filling method according to claim 1.

* * * * *